US009515643B2

(12) United States Patent
Truong et al.

(10) Patent No.: US 9,515,643 B2
(45) Date of Patent: Dec. 6, 2016

(54) HOT-SOCKET CIRCUITRY

(71) Applicant: Lattice Semiconductor Corporation, Hillsboro, OR (US)

(72) Inventors: Keith Truong, San Jose, CA (US); Brad Sharpe-Geisler, San Jose, CA (US); Ravi Lall, Portland, OR (US); Giap Tran, San Jose, CA (US)

(73) Assignee: LATTICE SEMICONDUCTOR CORPORATION, Portland, OR (US)

( * ) Notice: Subject to any disclaimer, the term of this patent is extended or adjusted under 35 U.S.C. 154(b) by 525 days.

(21) Appl. No.: 14/147,796

(22) Filed: Jan. 6, 2014

(65) Prior Publication Data

US 2015/0194953 A1    Jul. 9, 2015

(51) Int. Cl.
*H03K 17/08*    (2006.01)
*H03K 17/687*    (2006.01)
*H02H 9/04*    (2006.01)

(52) U.S. Cl.
CPC .............. *H03K 17/08* (2013.01); *H02H 9/043* (2013.01); *H03K 17/6872* (2013.01); *H02H 9/044* (2013.01)

(58) Field of Classification Search
CPC .... H03K 17/08; H03K 17/6872; H02H 9/043; H02H 9/044
See application file for complete search history.

(56) References Cited

U.S. PATENT DOCUMENTS

| 5,933,025 | A | * | 8/1999 | Nance | H03K 19/00315 |
| | | | | | 326/81 |
| 6,040,712 | A | | 3/2000 | Mejia | |
| 6,353,523 | B1 | | 3/2002 | Niv et al. | |
| 7,049,796 | B2 | | 5/2006 | Cherniski et al. | |
| 7,304,501 | B2 | | 12/2007 | Wang et al. | |
| 7,363,414 | B2 | | 4/2008 | Do | |
| 7,809,864 | B1 | * | 10/2010 | Young | G06F 1/266 |
| | | | | | 326/83 |
| 7,893,716 | B1 | | 2/2011 | Chui et al. | |

* cited by examiner

*Primary Examiner* — Zeev V Kitov (57) ABSTRACT

In one embodiment, an integrated circuit has hot-socket circuitry to protect I/O drivers during hot-socket events. The hot-socket circuitry has (i) N-well-to-pad switcher circuitry that ties driver PMOS N-wells to pads when the pad voltages are greater than the power-supply voltage and (ii) N-well-to-power-supply switcher circuitry that ties the driver PMOS N-wells to the power supply when the pad voltages are less than the power-supply voltage. The hot-socket circuitry also has a special PMOS device connected between the pad and a gate of at least one other PMOS device in the N-well-to-power-supply switcher circuitry to turn off the N-well-to-power-supply switcher circuitry quickly whenever the pad voltage is greater than the power-supply voltage. Applying a reduced power-supply voltage level to the gate of the special PMOS device enables the hot-socket circuitry to be implemented without having to use low Vt devices and without having to implement substantially large drive strengths.

9 Claims, 11 Drawing Sheets

HOT-SOCKET CIRCUITRY

BACKGROUND

Field of the Invention

The present invention relates to electronics and, more specifically but not exclusively, to hot-socket circuitry.

Description of the Related Art

This section introduces aspects that may help facilitate a better understanding of the invention. Accordingly, the statements of this section are to be read in this light and are not to be understood as admissions about what is prior art or what is not prior art.

Hot socketing, aka host swapping or hot plug, is the ability to insert an electronic component into or remove an electronic component from a system during system operation without causing the component to be damaged and without disturbing the operation of the system. Hot socketing is supported by providing special hot-socket circuitry that protects the rest of the component circuitry from overvoltage conditions that may occur while the component is either powering up or powering down. It is important for the hot-socket circuitry to turn on during a hot-socket power-up event before other circuitry (e.g., general-purpose input/output (I/O) circuitry) in the component turns on. To achieve this goal, conventional hot-socket circuitry is implemented either (i) using low Vt devices or (ii) with very strong drive strength compared to the other I/O circuitry. Unfortunately, using low Vt devices requires an extra step in the fabrication process, thereby increasing cost, and implementing stronger drive strength increases the layout area of the hot-socket circuitry.

BRIEF DESCRIPTION OF THE DRAWINGS

Other embodiments of the invention will become more fully apparent from the following detailed description, the appended claims, and the accompanying drawings in which like reference numerals identify similar or identical elements.

DETAILED DESCRIPTION

Figure 1:
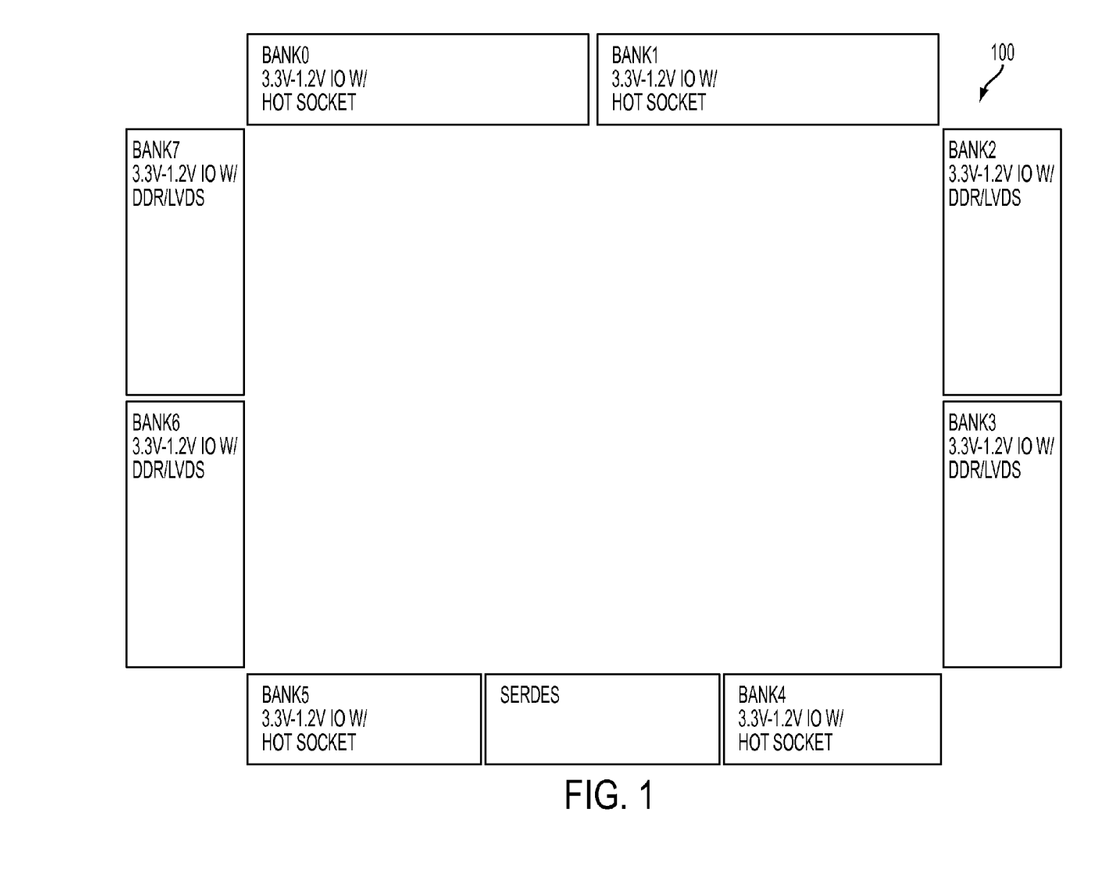
FIG. 1 shows a simplified diagram of the I/O banking scheme of an exemplary integrated circuit of the disclosure.

FIG. 1 shows a simplified diagram of the I/O banking scheme of an exemplary integrated circuit 100 of the disclosure. This particular I/O banking scheme has eight I/O banks (labeled BANK0-BANK7), where BANK0, BANK1, BANK4, and BANK5 contain 3.3V-1.2V I/O circuits with hot-socket capability; BANK2, BANK3, BANK6, and BANK7 are 3.3V-1.2V I/O circuits for DDR (dual or double data rate) and/or LVDS (low-voltage differential signaling) applications. In addition, integrated circuit 100 has a serializer/deserializer (SERDES) that is separate from and independent of the IC's I/O banking scheme. Other ICs of the disclosure may have other I/O banking schemes as long as one or more of the I/O circuits have hot-socket capability.

Although hot-socket capability refers to the ability of an I/O circuit to handle both hot-socket power-up events when components are plug into an operating system and hot-socket power-down events when components are removed from the operating system, as used in this specification, the term "hot-socket event" will be used to refer exclusively to hot-socket power-up events.

Figure 2:
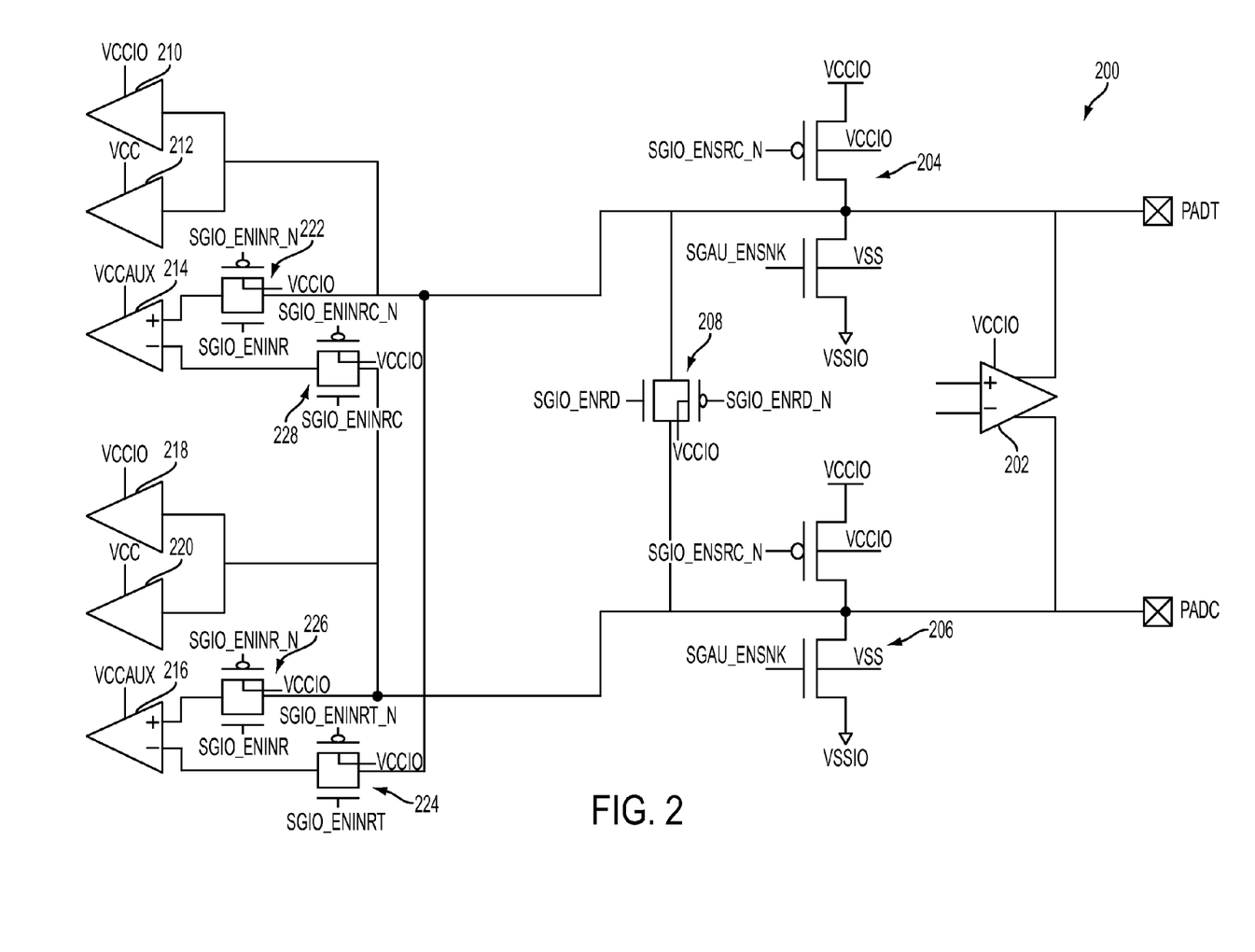
FIG. 2 shows a high-level schematic circuit diagram of I/O circuitry configured in true and complementary fashion and used in the banks of the IC of FIG. 1 that do not support hot socketing.

FIG. 2 shows a high-level schematic circuit diagram of an I/O circuit 200 used in the banks of IC 100 of FIG. 1 that do not support hot socketing (i.e., BANK2, BANK3, BANK6, and BANK7). During differential output driving operations, differential output driver 202 generates and applies a differential output signal at true and complement I/O pads PADT and PADC. During single-ended output driving operations, single-ended output driver 204 generates and applies a single-ended output signal at I/O pad PADT and/or single-ended output driver 206 generates and applies a single-ended output signal at I/O pad PADC.

During single-ended or differential input driving operations, one or two input signals are applied at I/O pads PADT and PADC, where the input signal at PADT is applied to VCCIO-domain true input driver 210, VCC-domain true input driver 212, the true input of VCCAUX-domain differential input driver 214 via pass gate 222, and the complement input of VCCAUX-domain inverted differential input driver 216 via pass gate 224. Similarly, the input signal at PADC is applied to VCCIO-domain complement input driver 218, VCC-domain complement input driver 220, the true input of VCCAUX-domain differential input driver 216 via pass gate 226, and the complement input of VCCAUX-domain inverted differential input driver 214 via pass gate 228. Although not shown in FIG. 2, I/O circuit 200 may also include true and complement single-ended input buffers powered by VCCAUX and driven by input signals applied at PADT and PADC, respectively. Note that the N-wells of the PMOS devices in output drivers 204 and 206 as well as in pass gates 222, 224, 226, and 228 are all tied to VCCIO.

Figure 3:
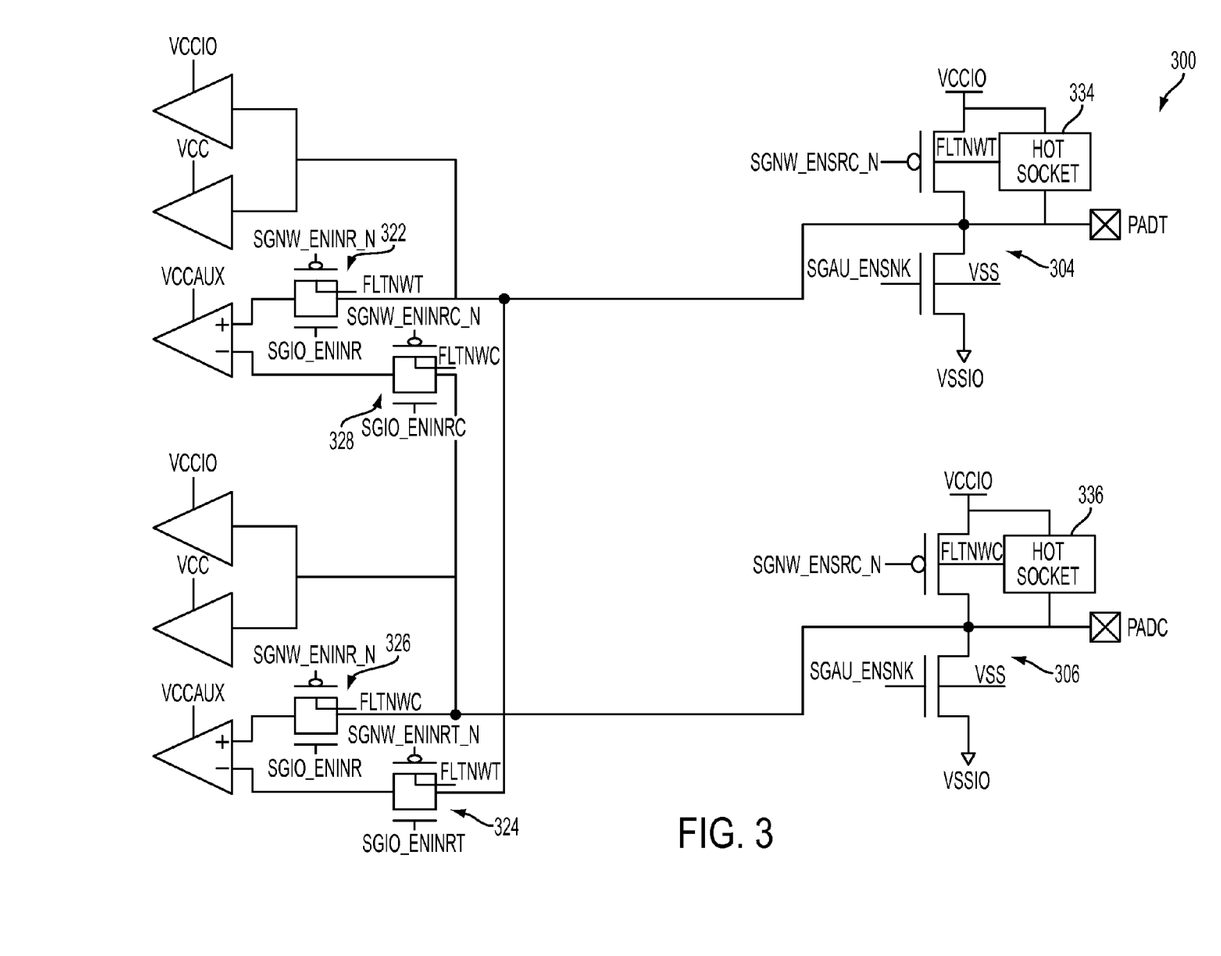
FIG. 3 shows a high-level schematic circuit diagram of I/O circuitry configured in true and complementary fashion and used in the banks of the IC of FIG. 1 that do support hot socketing.

FIG. 3 shows a high-level schematic circuit diagram of an I/O circuit 300 used in the banks of IC 100 of FIG. 1 that do support hot socketing (i.e., BANK0, BANK1, BANK4, and BANK5). I/O circuit 300 is similar to I/O circuit 200 of FIG. 2 with (at least) the following differences. The N-wells of the PMOS devices in output driver 304 and in pass gates 322 and 324 are tied to voltage FLTNWT, which is generated by true hot-socket circuit 334, while the N-wells of the PMOS devices in output driver 306 and in pass gates 328 and 326 are tied to voltage FLTNWC, which is generated by complement hot-socket circuit 336. In addition, the gates of those six PMOS devices are driven by voltage signals that are different from those used in FIG. 2. Although not directly relevant to the present invention, I/O circuit 300 also does not include a differential output driver, like LVDS driver 202 of FIG. 2, or a differential resistor, like DIFFRES 208 of FIG. 2.

During normal operations, the power supply voltages (e.g., VCC, VCCIO, VCCAUX) in IC 100 will be at their nominal, high-voltage operating levels, and the signals applied to the I/O pads (e.g., PADT, PADC) will be less than or equal to those nominal levels. During such normal operations, the N-wells of PMOS devices should be tied to the corresponding power supply voltage, and the N-wells of NMOS devices should be tied to ground (e.g., VSS, VSSIO, VSSAUX).

During a transient, hot-socket event in which the power supply voltages ramp up to their nominal operating levels, however, the voltages appearing at the I/O pads may, at different times, be greater than, less than, or equal to the instantaneous, ramping power supply voltages. In order to protect other I/O circuitry from harmful overvoltage conditions that may exist during a hot-socket event and to avoid excessive leakage currents, hot-socket circuits 334 and 336, and other hot-socket circuitry to be described later, but not shown in FIG. 3, are designed to turn off output drivers 304 and 306 and pass gates 322, 324, 326, and 328 until the end of the hot-socket event, when the power supply voltages have sufficiently approached their nominal operating levels. In addition, during a hot-socket event, the N-wells of particular PMOS devices are driven by pad voltages whenever the pad voltages are sufficiently higher than the corresponding power supply voltages. When the power supply voltages approach and exceed the pad voltages, the PMOS N-wells are switched to being tied to the power supply voltages, which again is the normal operating configuration.

To achieve these goals, true hot-socket circuit 334 is designed to generate the true N-well voltage signal FLTNWT to be the greater of VCCIO and the voltage at PADT. Similarly, complement hot-socket circuit 336 is designed to generate the complement N-well voltage signal FLTNWC to be the greater of VCCIO and the voltage at PADC. During normal operations in which VCCIO is greater than or equal to the voltages at both PADT and PADC, hot-socket circuits 334 and 336 will tie both N-well voltage signals FLTNWT and FLTNWC to VCCIO. However, during a hot-socket event in which PADT and/or PADC may be greater than VCCIO, the hot-socket circuits will set the N-well voltage signals to the greater of VCCIO and the corresponding pad voltage.

In addition, during a hot-socket event, the gate voltage signals applied to the PMOS devices in output drivers 304 and 306 as well as to the PMOS devices in pass gates 322, 324, 326, and 328 are all driven high, while the gate voltage signals applied to the NMOS devices in those output drivers and pass gates are all driven low to ensure that the two output drivers and four pass gates are all turned off during the hot-socket event. During normal operations, the output drivers and pass gates are selectively turned on or off as needed for those normal operations.

Figure 4:
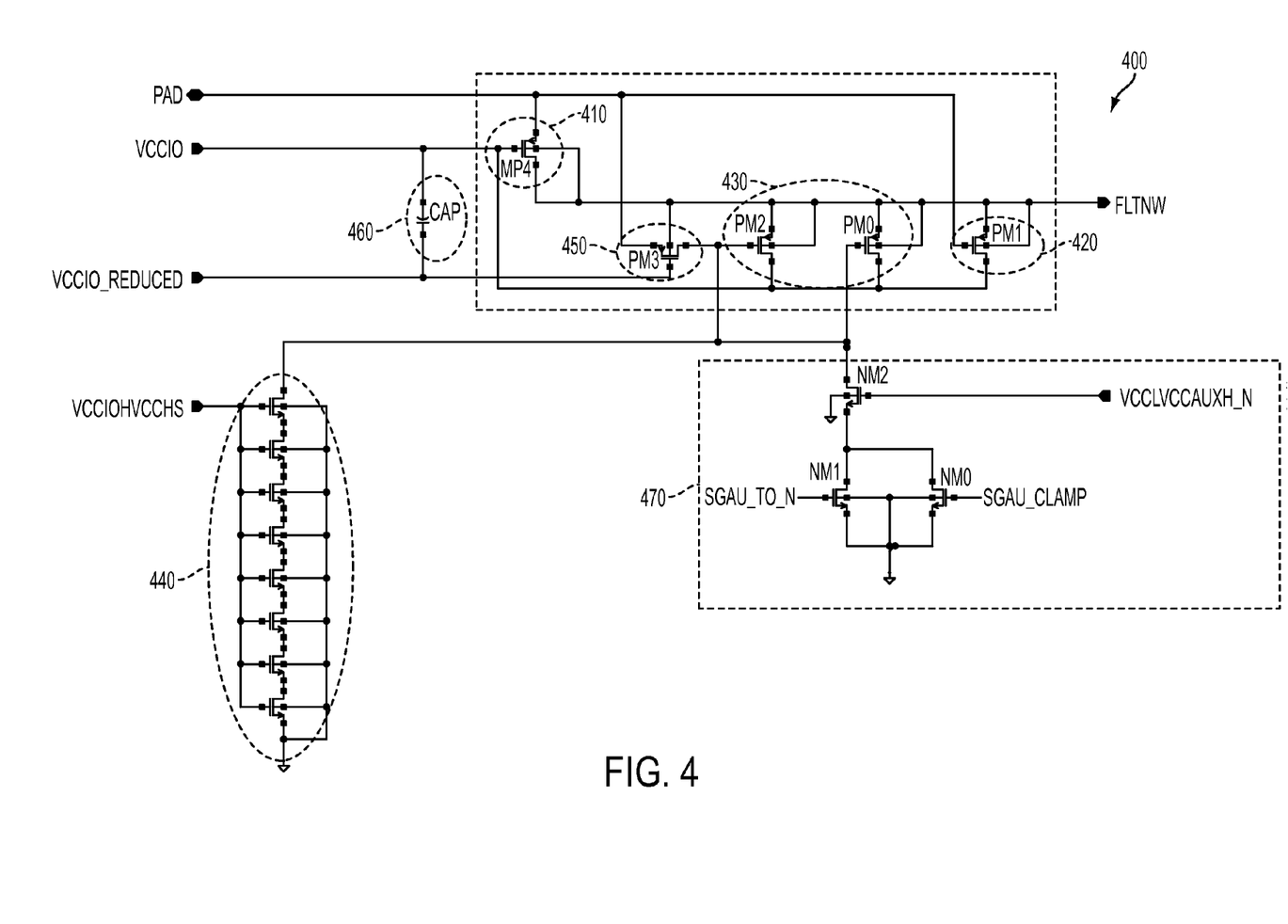
FIG. 4 shows a schematic circuit diagram of a hot-socket circuit that can be used to implement each of the hot-socket circuits of FIG. 3.

In FIG. 3, the signals SGNW_ENINR_N, SGNW_ENINRC_N, SGNW_ENINRT_N, SGIO_ENINR, SGIO_ENINRC, and SGIO_ENINRT are all driven by FLTNW (as shown in FIG. 4 and described in the following paragraph) and are therefore rail-to-rail signals (i.e., from ground to the higher of PAD and VCCIO). This guarantees that pass gates 322, 324, 326, and 328 are completely off during a hot-socket event to avoid excessive leakage.

FIG. 4 shows a schematic circuit diagram of hot-socket circuit 400, which can be used to implement each of hot-socket circuits 334 and 336 of FIG. 3. When used to implement true hot-socket circuit 334, signals PAD and FLTNW of FIG. 4 are signals PADT and FLTNWT, respectively, of FIG. 3, and, when used to implement complement hot-socket circuit 336, signals PAD and FLTNW of FIG. 4 are signals PADC and FLTNWC, respectively, of FIG. 3. Hot-socket circuit 400 comprises seven subsets of circuitry labeled 410-470.

When VCCIO is less than PAD, PMOS transistor MP4 of circuitry 410 is on, which drives N-well voltage signal FLTNW to PAD (i.e., the higher of VCCIO and PAD). When VCCIO is greater than PAD, device MP4 is off, but PMOS device PM1 of circuitry 420 is on, which drives N-well voltage signal FLTNW to VCCIO (i.e., the higher of VCCIO and PAD).

When VCCIO is about equal to PAD, neither device MP4 nor PM1 will be sufficiently on or even on at all. To handle this voltage condition, PMOS devices PM2 and PM0 of circuitry 430 turn on, which drives output signal FLTNW to VCCIO. Since, during normal operations, VCCIO is greater than or about equal to PAD and never much if any less than PAD, hot-socket circuit 400 is designed to drive FLTNW to VCCIO whenever VCCIO and PAD are substantially equal.

To ensure that PMOS devices PM2 and PM0 are turned on whenever VCCIO is about equal to PAD, circuitry 440 is designed to pull the gates of devices PM2 and PM0 low. Circuitry 440 includes a number (e.g., eight in this particular implementation) of NMOS devices connected series to function as a single NMOS transistor having a very long effective channel length and reduced DC bias. The gates of the NMOS devices in circuitry 440 are driven by the voltage signal VCCIOHVCCHS, which is either (i) a fraction of VCCIO when VCCIO is relatively high or (ii) a (positive) minimum voltage level when VCCIO is relatively low. In one possible implementation, the voltage signal VCCIOHVCCHS is (i) one half of VCCIO whenever VCCIO is greater than 2.4V and (ii) 1.2V whenever VCCIO is less than 2.4V. In this way, the NMOS devices in circuitry 440 are assured of being on whenever VCCIO is about equal to PAD in order to drive the gates of devices PM2 and PM0 low during those situations.

PMOS device PM3 of circuitry 450 is provided to turn off devices PM2 and PM0 of circuitry 430 quickly whenever PAD exceeds VCCIO, so that FLTNW will be tied to PAD through device MP4 of circuitry 410 and not to VCCIO through devices PM2 and PM0. As shown in FIG. 4, the gate of device PM3 is driven by voltage signal VCCIO_REDUCED, which is generated to be a specific voltage (e.g., 0.2V) below VCCIO.

If and when, during a hot-socket event, PAD approaches VCCIO or becomes greater than VCCIO, applying a voltage signal (i.e., VCCIO_REDUCED) that is less than VCCIO to the gate of PMOS device PM3 of circuitry 450 will cause device PM3 to turn on quicker than if VCCIO were applied to the PM3 gate. Turning on device PM3 quicker causes PMOS devices PM2 and PM0 in circuitry 430 to turn off quicker, which results in FLTNW being switched sooner to being tied to PAD. In particular, biasing the gate of device PM3 to a VCCIO-reduced level helps device PM3 turn on easily as PAD transitions to or above the VCCIO level, thereby putting devices PM2 and PM0 in cutoff mode, which avoids FLTNW from being pulled to some intermediate state that might cause the output driver (e.g., 304 or 306 of FIG. 3) to be turned on unintentionally and draw undesirably large current leakage.

As described, hot-socket circuit 400 employs gate-biased transistor PM3 of circuitry 450 to switch the N-well voltage signal FLTNW to PAD quickly during a hot-socket event. When PAD is greater than VCCIO, the N-well of the PMOS device in the corresponding output driver of FIG. 3 is driven to PAD very quickly without causing huge pin leakage. This is achieved by biasing the gate of device PM3 of circuitry 450 such that device PM3 turns on quickly to turn off devices PM2 and PM0 in circuitry 430.

Capacitor CAP of circuitry 460 is provided to stabilize VCCIO_REDUCED to keep it tracking with VCCIO as VCCIO varies during a hot-socket event.

Circuitry 470 is the logic to perform clamping. Circuitry 470 provides a clamping action, taking advantage of the devices PM2 and PM0 of circuitry 430. A clamping action occurs when the PAD voltage is greater than VCCIO by a certain amount, e.g., 1V, and the specification requires a minimum current, e.g., 25 mA, to exist from PAD to VCCIO. During normal operation, the signal sgau_vcclvccauxh_n is high, thereby turning the NMOS device NM2 on. If either or both of the signals sgau_clamp and sgau_to_n are also high, then one or both of NMOS devices NM0 and NM1 will be turned on. This, in turn, will drive the gates of PMOS devices PM0 and PM2 of circuitry 430 low, thereby turning these devices on, thus allowing for a current path from PAD to FLTNW to VCCIO. This is considered to be a clamping action. During a hot-socket event, the signal sgau_vcclvccauxh_n is low; therefore, circuitry 470 is not causing any disturbance/noise to the rest of hot-socket circuitry 400.

Figure 5:
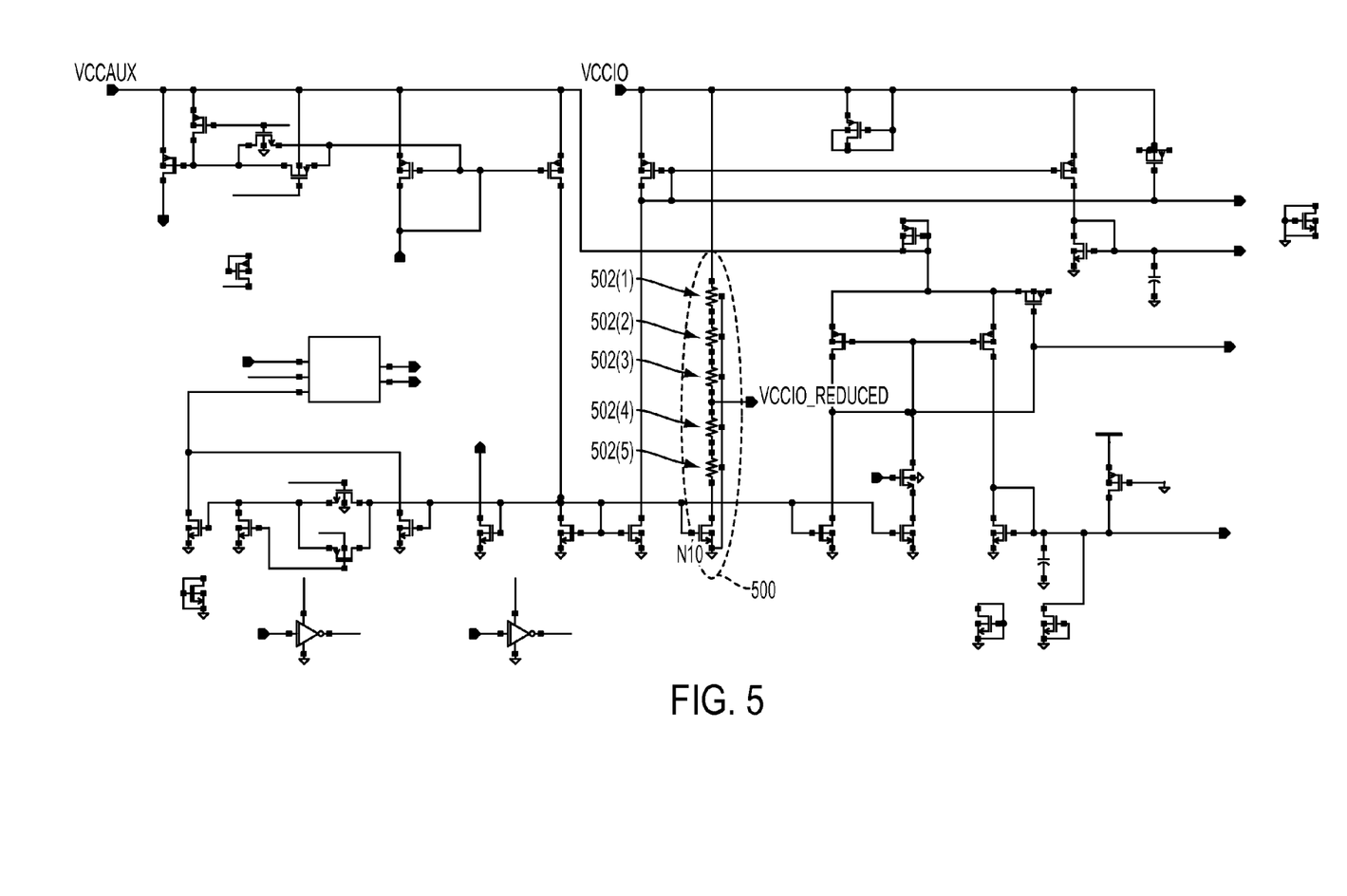
FIG. 5 shows a schematic circuit diagram of a biasing circuitry that generates the voltage signal VCCIO_REDUCED.

FIG. 5 shows a schematic circuit diagram of biasing circuitry 500, which generates the voltage signal VCCIO_REDUCED that is applied to the gate of device PM3 of circuitry 450 in FIG. 4. Circuitry 500 comprises a series combination of (e.g., five in this exemplary implementation) resistors 502 and NMOS current-mirror device N10 where, in this exemplary implementation, the voltage signal VCCIO_REDUCED is tapped between resistors 502(3) and 502(4). In this particular implementation, the resistors and transistors are sized such the current flowing through current-mirror device N10 results in VCCIO_REDUCED being about 0.2V below VCCIO. In other implementations, the series combination may be tapped between two different resistors to provide a different value for VCCIO_REDUCED.

The other circuitry in FIG. 5 includes current mirrors with a 10 uA constant current from the bandgap and generates 10 uA and 50 uA current references for biasing the differential driver and PVT calibration circuitries (not shown) of the chip, as well as other voltage reference signals to control slew rates and weak pullup/pulldown of the I/O.

Figure 6:
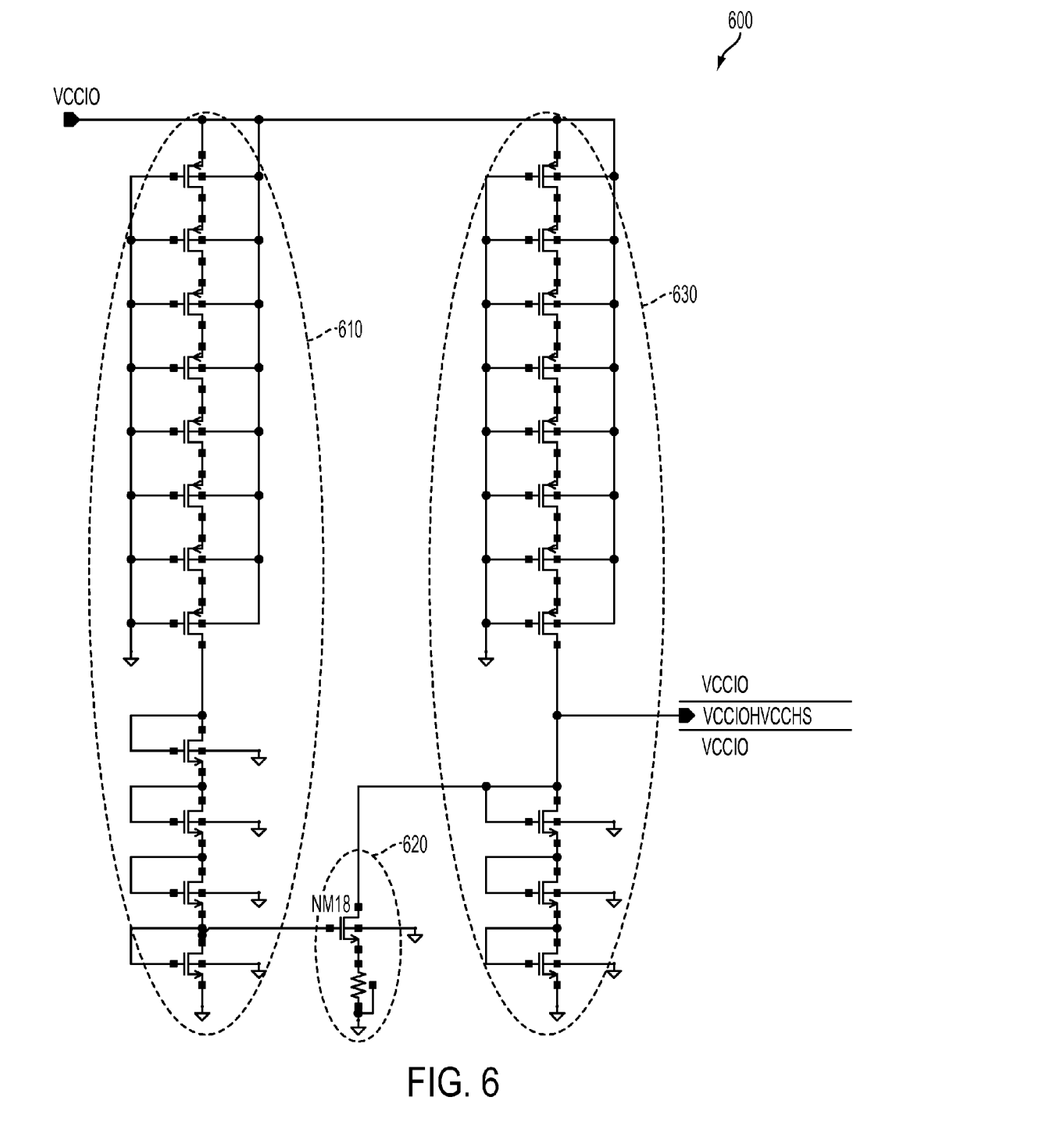
FIG. 6 shows a schematic circuit diagram of circuitry that generates the pseudo-linear voltage signal VCCIOHVCCHS.

FIG. 6 shows a schematic circuit diagram of circuitry 600, which generates the pseudo-linear voltage signal VCCIOHVCCHS that is applied to the gates of the NMOS devices in current-bleed circuitry 440 of FIG. 4. Pseudo-linear circuitry 600 is implemented to control the gate of current-bleed circuitry 440 to keep the current-bleed circuitry turned on strongly across the power supply voltage VCCIO from about 1.2V to about 3.3V. Circuitry 600 has three sets of circuitry 610, 620, and 630, where circuitries 610 and 630 each comprise a series-connected stack of PMOS devices and diode-connected NMOS devices. Circuitry 620 functions as a steerer.

When VCCIO is relatively large (e.g., 2.5V or greater), the stack of circuitry 610 is on, and NMOS device NM18 in circuitry 620 steers the stack of circuitry 630 to mirror the current through the stack of circuitry 610, which, in turn, lowers the output voltage and sets the voltage signal VCCIOHVCCHS to be around 1.3V-1.6V.

When VCCIO is relatively small (e.g., 1.8V or smaller), the stack of circuitry 610 is off, and the voltage signal VCCIOHVCCHS is at three diodes above ground due to the stack of circuitry 630, which, in turn, sets the voltage signal VCCIOHVCCHS to be around 1.2V-1.6V.

Thus, circuitry 600 generates the voltage signal VCCIOHVCCHS to be (i) about half of VCCIO when VCCIO is greater than about 2.5V and (ii) about 1.2V-1.6V when VCCIO is less than about 2.5V. In this way, the NMOS devices in circuitry 440 of FIG. 4 will remain on for all levels of VCCIO.

Circuitry 440 of FIG. 4 functions as a VCCIO-based constant bleed-current source that enables the N-well voltage signal FLTNW to switch to VCCIO quickly whenever VCCIO exceeds PAD during a hot-socket event. When VCCIO is greater than or equal to PAD, device MP4 of circuitry 410 is turned off, and device PM1 of circuitry 420 is turned on, thereby tying FLTNW to VCCIO. Leaking the gates of devices PM2 and PM0 of circuitry 430 via current-bleed circuitry 440 to ground enables this transition to occur quickly. Because the bleed current source is VCCIO-based and because VCCIO varies from 1.2V to 3.3V, circuitry 600 employs a design technique to control the current source (i.e., circuitry 440) to keep it relatively constant to allow for a reliable switching action of the N-well voltage signal to VCCIO.

Figure 7:
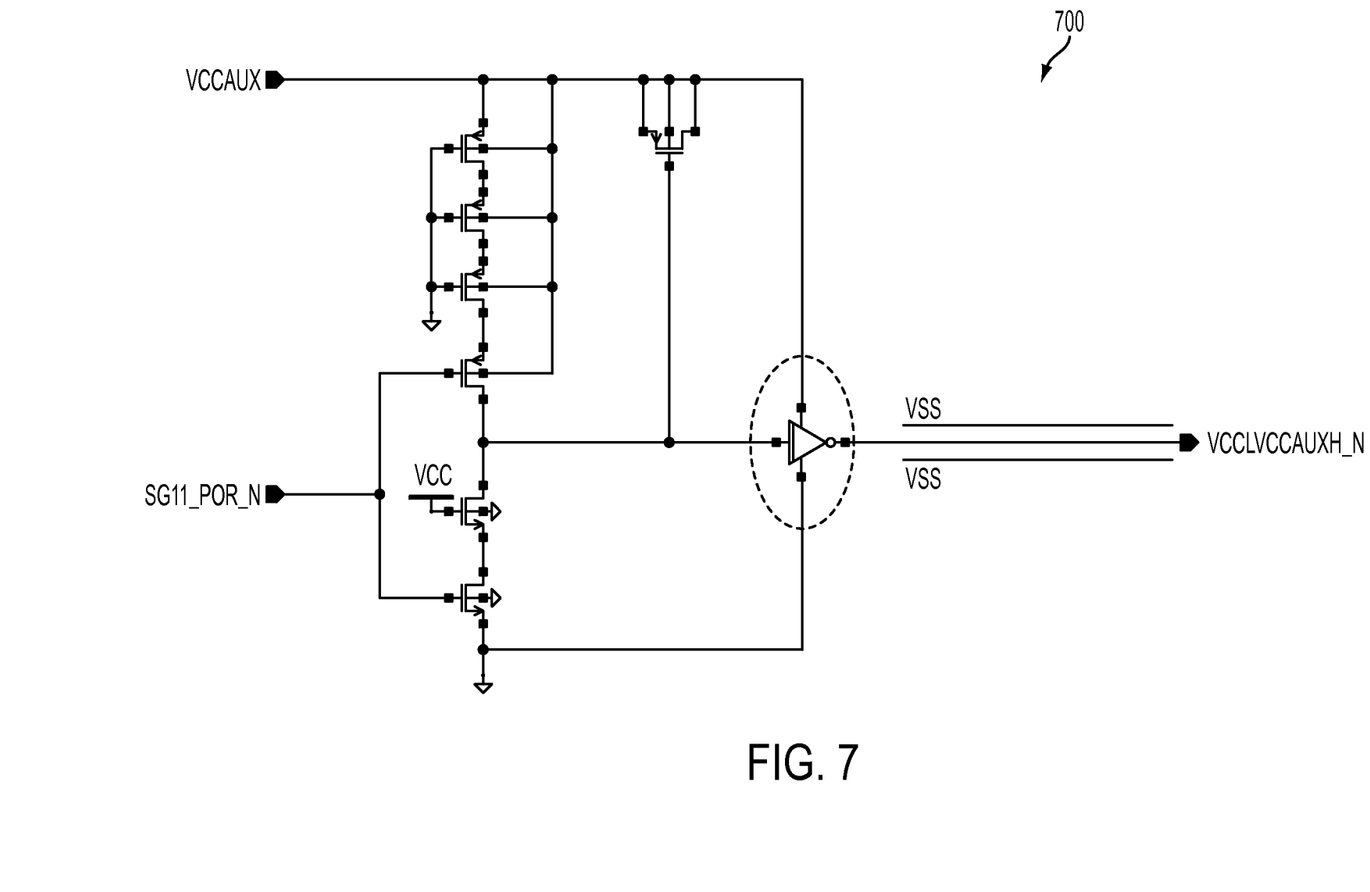
FIG. 7 shows a schematic circuit diagram of the VCCAUX detector circuitry that generates the voltage signal VCCLVCCAUXH_N.

FIG. 7 shows a schematic circuit diagram of VCCAUX detector circuitry 700, which generates voltage signal VCCLVCCAUXH_N that is applied to clamp circuitry 470 of FIG. 4. VCCAUX detector circuitry 700 determines whether VCC is already high and the powering up sequence is completed at the time that VCCAUX become high. When VCC is low or still powering up, the active-low voltage signal VCCLVCCAUXH_N is pulled low.

VCCAUX detector circuitry 700 shuts off VCCAUX-based level shifters and other circuitry associated with the NMOS devices in the output drivers of I/O circuit 300. Because VCCAUX is the IC's common auxiliary supply, only one VCCAUX detector is needed for the entire IC. During a hot-socket event, the VCCAUX detector sends out a global VCCAUX signal to reset the VCCAUX-based level shifters and pull the gates of the NMOS devices in the output drivers to ground to avoid excess leakage from PAD to ground.

Figure 8:
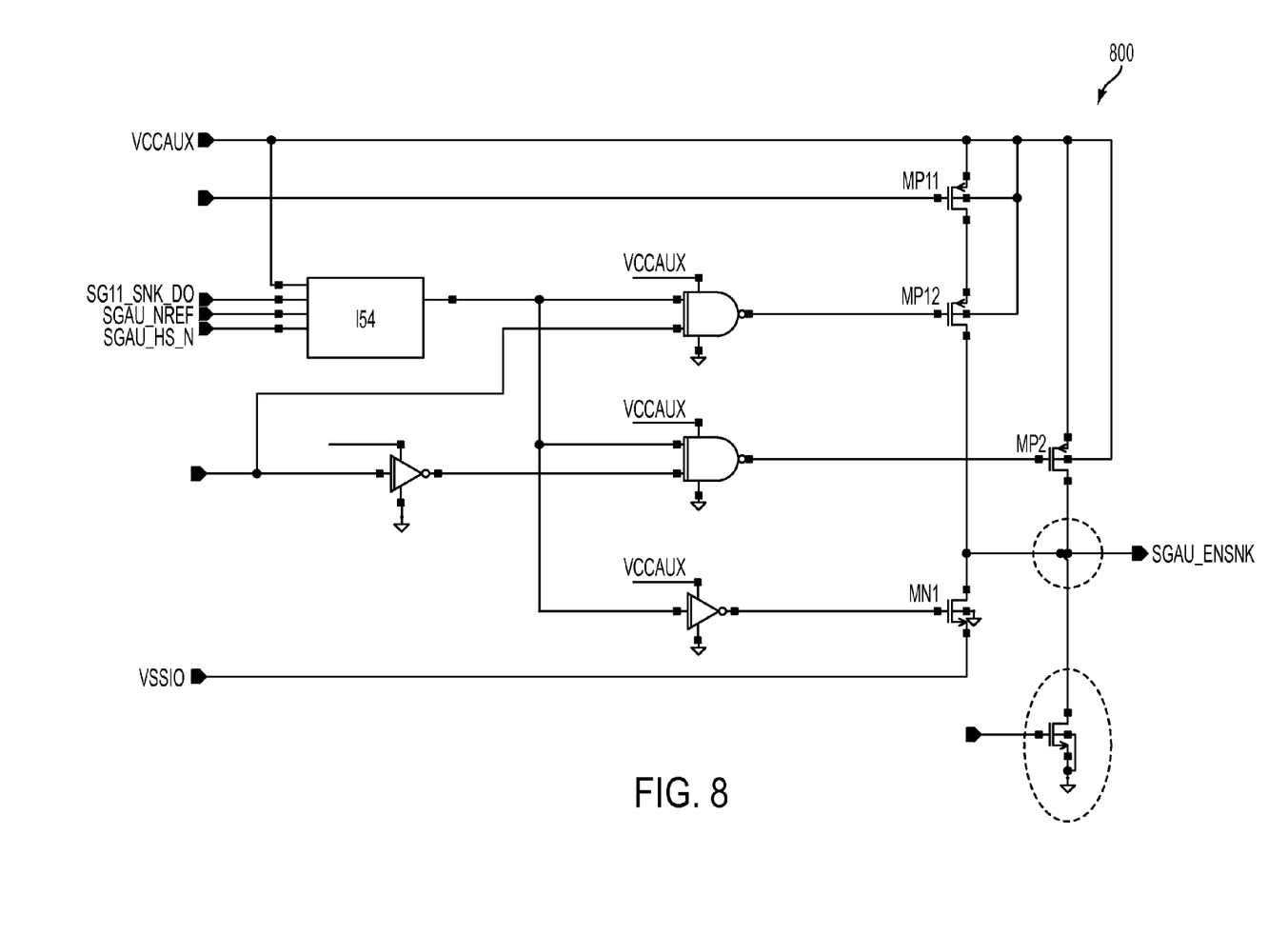
FIG. 8 shows a schematic circuit diagram of circuitry that generates the voltage signal SGAU_ENSNK.

FIG. 8 shows a schematic circuit diagram of circuitry 800, which generates the voltage signal SGAU_ENSNK, which is applied to the gates of the NMOS devices in output drivers 304 and 306 of FIG. 3. During a hot-socket event, the voltage signal SGAU_ENSNK is driven low to ensure that the NMOS devices in the output drivers are turned off. This is achieved by circuit block 154 with signal sgau_hs_n acting as a reset signal to reset the output signal sgau_snk_do_n1 which, in turn, turns on transistor mn1 to pull signal SGAU_ENSNK low.

Figure 9:
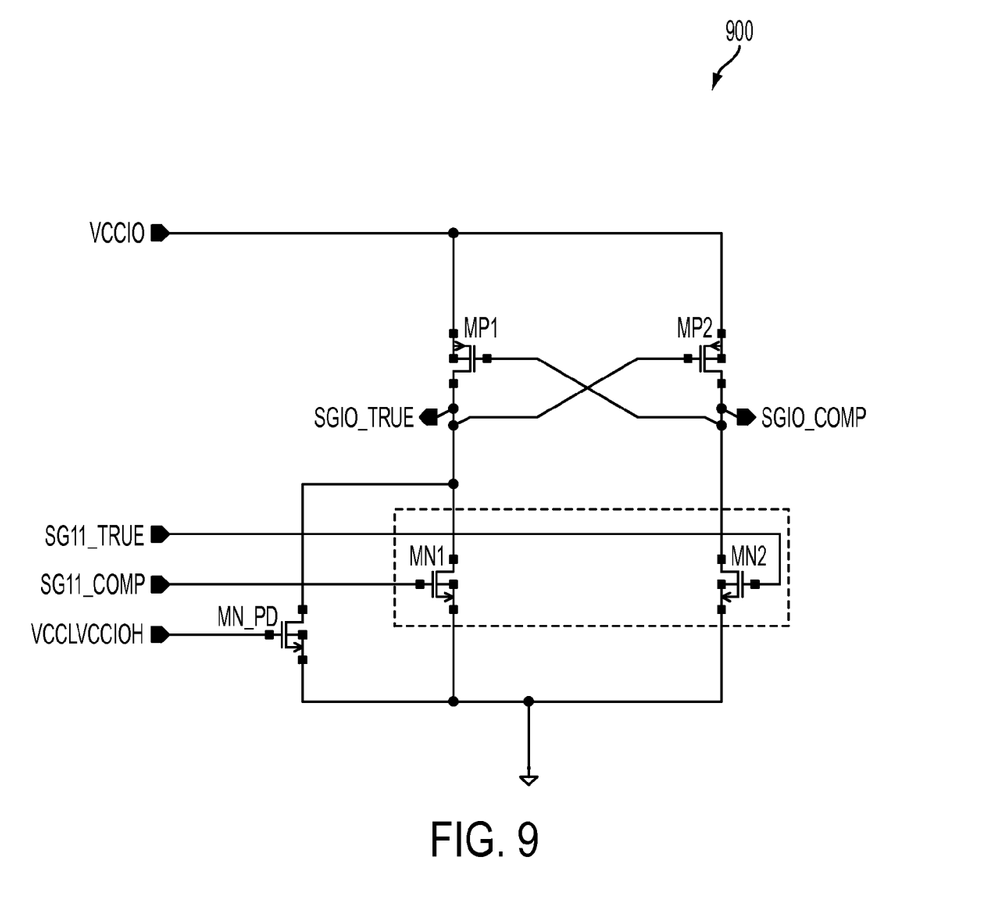
FIG. 9 shows a schematic circuit diagram of level-shifting circuitry that converts true and complement signals SG11_TRUE and SG11_COMP from a low-voltage domain into true and complement signals SGIO_TRUE and SGIO_COMP in the VCCIO voltage domain.

FIG. 9 shows a schematic circuit diagram of level-shifting circuitry 900, which converts true and complement signals SGI1_TRUE and SGI1_COMP from a low-voltage (e.g., 1.1V) domain into true and complement signals SGIO_TRUE and SGIO_COMP in the VCCIO voltage domain. During a hot-socket event, the voltage signal VCCLVCCIOH is driven high, which turns on NMOS device MN_PD, which in turn ensures that SGIO_TRUE and SGIO_COMP are driven low and high during the hot-socket event to avoid any undeterministic state at the output, which would cause excessive leakage.

Figure 10:
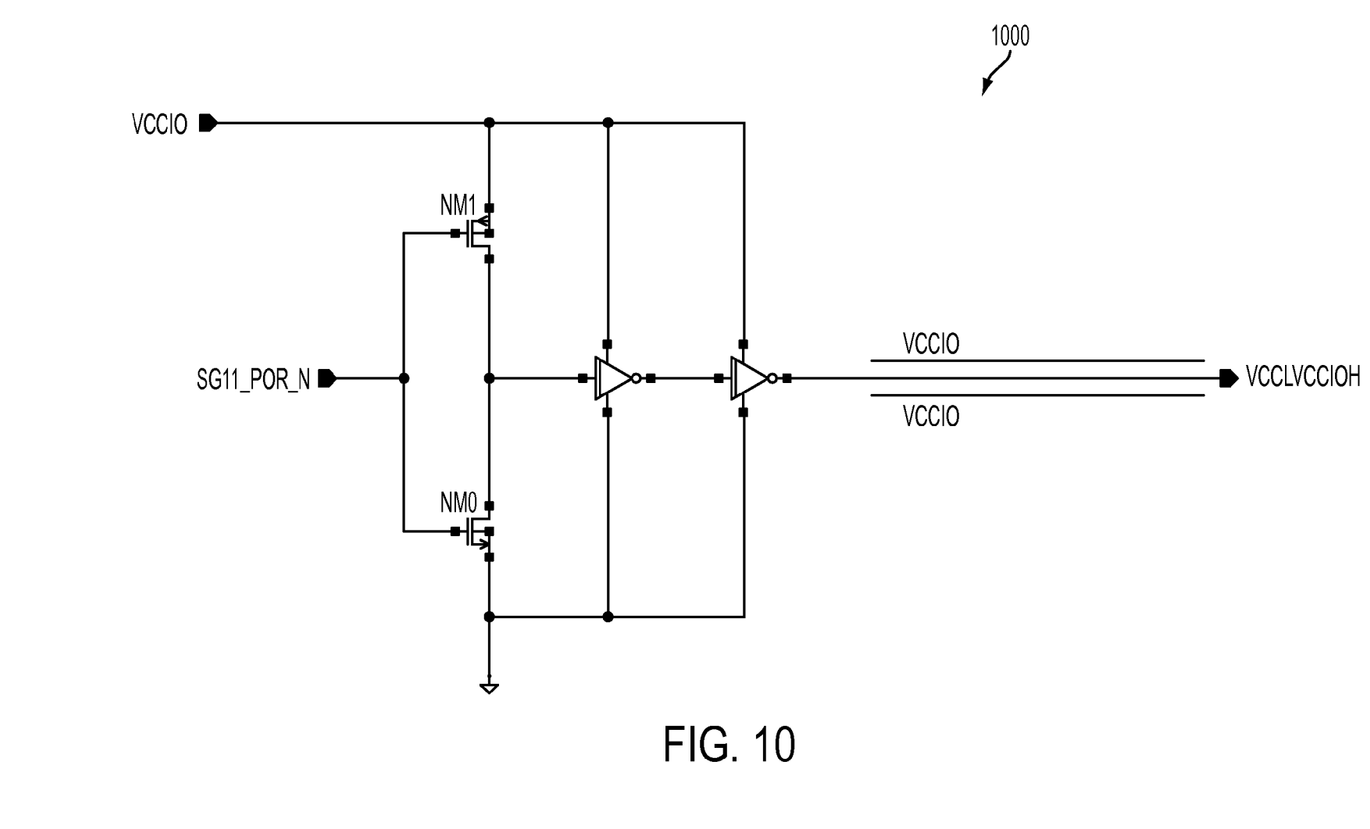
FIG. 10 shows a schematic circuit diagram of a VCCIO detector circuitry that generates the voltage signal VCCLVCCIOH.

FIG. 10 shows a schematic circuit diagram of VCCIO detector circuitry 1000, which generates the voltage signal VCCLVCCIOH that is applied to the gate of NMOS device MN_PD of FIG. 9. VCCIO detector circuitry 1000 determines whether power-up operation has been completed at the time VCCIO is high. Circuitry 1000 contains three inverters. During power on reset (POR), when power supplies VCC, VCCIO, and VCCAUX are ramping up, the voltage signal SG11_POR_N is low. When SG11_POR_N is low and VCCIO is high, the output of the three inverters of circuitry 1000 (i.e., VCCLVCCIOH) is high to reset the level-shifting circuitry 900. After the power on reset is completed, signal SG11_POR_N is high, which drives signal VCCLVCCIOH low and puts the level-shifting circuitry 900 in normal operation.

VCCIO detector circuitry 1000 shuts off VCCIO-based level shifters and other circuitry associated with the PMOS devices in the output drivers of I/O circuit 300. Because VCCIO is the bank power supply, each I/O bank has its own VCCIO detector. During a hot-socket event, the VCCIO detector sends out a global VCCLVCCIOH signal to reset the VCCIO-based level shifters and pull the gates of the PMOS devices in the output drivers to the N-well voltage signal FLTNW to avoid excess leakage from PAD to VCCIO.

Figure 11:
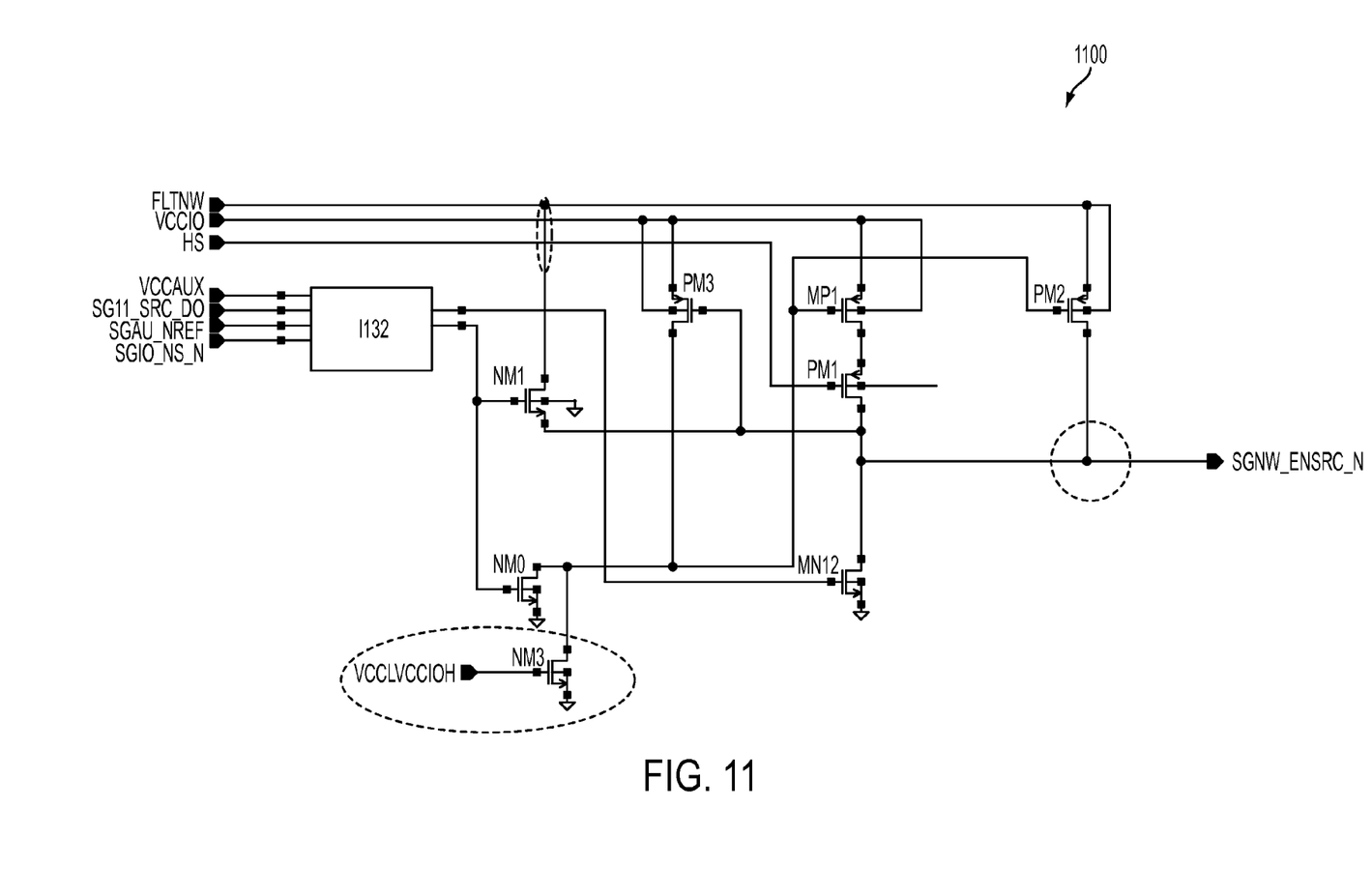
FIG. 11 shows a schematic circuit diagram of circuitry that generates the voltage signal SGNW_ENSRC_N.

FIG. 11 shows a schematic circuit diagram of circuitry 1100, which generates the voltage signal SGNW_ENSRC_N that is applied to the gates of the PMOS devices in output drivers 304 and 306 of FIG. 3. During a hot-socket event, the voltage signal SGNW_ENSRC_N is driven to FLTNW, which is the highest voltage level at PAD or VCCIO, to ensure that the PMOS devices in the output drivers are turned off. This is achieved by VCCLVCCIOH being high, which pulls the drain of transistor NM3 low, turning on transistor PM2 and allowing FLTNW to drive signal SGNW_ENSRC_N.

The hot-socket circuitry described above can be implemented without having to use low Vt devices and without having to implement substantially large drive strengths. As such, the hot-socket circuitry of the disclosure can be implemented with less cost and/or less layout area than comparable prior-art hot-socket circuitry.

Embodiments of the invention may be implemented as (analog, digital, or a hybrid of both analog and digital) circuit-based processes, including possible implementation as a single integrated circuit (such as an ASIC or an FPGA), a multi-chip module, a single card, or a multi-card circuit pack.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Also, for purposes of this disclosure, it is understood that all gates are powered from a fixed-voltage power domain (or domains) and ground unless shown otherwise. Accordingly, all digital signals generally have voltages that range from approximately ground potential to that of one of the power domains and transition (slew) quickly. However and unless stated otherwise, ground may be considered a power source having a voltage of approximately zero volts, and a power source having any desired voltage may be substituted for ground. Therefore, all gates may be powered by at least two power sources, with the attendant digital signals therefrom having voltages that range between the approximate voltages of the power sources.

Signals and corresponding nodes, ports, or paths may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

As used in this specification and claims, the term "channel node" refers generically to either the source or drain of a metal-oxide semiconductor (MOS) transistor device (also referred to as a MOSFET), the term "channel" refers to the path through the device between the source and the drain, and the term "control node" refers generically to the gate of the MOSFET. Similarly, as used in the claims, the terms "source," "drain," and "gate" should be understood to refer either to the source, drain, and gate of a MOSFET or to the emitter, collector, and base of a bi-polar device when an embodiment of the invention is implemented using bi-polar transistor technology.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain embodiments of this invention may be made by those skilled in the art without departing from embodiments of the invention encompassed by the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

What is claimed is:

1. An integrated circuit comprising:
a driver; and
hot-socket circuitry configured to protect the driver during hot-socket events, wherein the hot-socket circuitry comprises:
   N-well-to-pad switcher circuitry configured to tie an N-well of a first transistor device in the driver to a pad for the driver, when the pad has a higher voltage level than a power supply voltage for the driver;
   N-well-to-power-supply switcher circuitry configured to tie the N-well of the first transistor device in the driver to the power supply voltage, when the pad has a lower voltage level than the power supply voltage; and
   a second transistor device having its channel connected between the pad and a gate of at least one other transistor device in the N-well-to-power-supply switcher circuitry and its gate connected to a gate voltage signal generated to be a specified voltage level below the power supply voltage.

2. The integrated circuit of claim 1, further comprising circuitry configured to generate the gate voltage signal.

3. The integrated circuit of claim 2, wherein the circuitry configured to generate the gate voltage signal comprises a resistor series connected to a current mirror, wherein the gate voltage signal is tapped from the resistor series.

4. The integrated circuit of claim 1, further comprising a capacitor connected between the power supply voltage and the gate voltage signal and configured to improve tracking of the power supply voltage by the gate voltage signal.

5. The integrated circuit of claim 1, wherein:
the driver is an output driver; and
the first, second, and at least one other transistor device are PMOS devices.

6. The integrated circuit of claim 1, wherein pseudo-linear circuitry is implemented to control a gate of current-bleed circuitry to keep the current-bleed circuitry turned on strongly across the power supply voltage VCCIO from about 1.2V to about 3.3V.

7. An integrated circuit comprising:
a driver including a transistor n-well; and
hot-socket circuitry configured to protect the driver during hot-socket events, wherein the hot-socket circuitry comprises:
   a first transistor having a gate and channel, the first transistor gate coupled to a first voltage source of the integrated circuit and the first transistor channel coupled between a pad for the integrated circuit and the driver transistor n-well;
   a second transistor having a gate and a channel, the second transistor gate coupled to the pad and the second transistor channel coupled between the first voltage source and the driver transistor n-well;
   a third transistor having a gate and a channel, the third transistor channel coupled between the first voltage source and the driver transistor n-well; and
   a fourth transistor having a gate and a channel, the fourth transistor gate coupled to a second voltage source of the integrated circuit and the fourth transistor channel coupled between the pad and the gate of the third transistor,
wherein the voltage level of the second voltage source is specified below the voltage level of the first voltage source.

8. The integrated circuit of claim 7 including a fifth transistor having a gate and channel, the fifth transistor gate coupled to a third voltage source of the integrated circuit and the fifth transistor channel coupled between the gate of the third transistor and ground.

9. The integrated circuit of claim 8 wherein the first, second, third, and fourth transistors are PMOS devices and the fifth transistor is an NMOS device.

* * * * *